United States Patent
Ro et al.

(10) Patent No.: US 9,418,914 B2
(45) Date of Patent: Aug. 16, 2016

(54) PACKAGE SUBSTRATES, SEMICONDUCTOR PACKAGES HAVING THE PACKAGE SUBSTRATES

(71) Applicants: YoungHoon Ro, Hwaseong-si (KR); Seung Hwan Kim, Hwaseong-si (KR); Jung-Ho Park, Seoul (KR)

(72) Inventors: YoungHoon Ro, Hwaseong-si (KR); Seung Hwan Kim, Hwaseong-si (KR); Jung-Ho Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 14/014,810

(22) Filed: Aug. 30, 2013

(65) Prior Publication Data

US 2014/0063723 A1 Mar. 6, 2014

(30) Foreign Application Priority Data

Aug. 30, 2012 (KR) ........................ 10-2012-0095594

(51) Int. Cl.
*H05K 7/00* (2006.01)
*H01L 23/48* (2006.01)
*H01L 23/498* (2006.01)

(52) U.S. Cl.
CPC ........ *H01L 23/481* (2013.01); *H01L 23/49855* (2013.01); *H01L 23/49894* (2013.01); *H01L 2224/131* (2013.01); *H01L 2224/16238* (2013.01); *H01L 2224/45144* (2013.01); *H01L 2224/48228* (2013.01)

(58) Field of Classification Search
CPC ............ H01L 23/49894; H01L 23/481; H01L 23/49855; H01L 2224/48228; H01L 2224/48; H01L 2224/45144; H01L 2224/16238; H01L 2224/131; H01L 2924/014; H01L 2924/00

USPC ................ 361/813, 820, 760, 763, 782, 783; 174/520, 536, 260, 261

See application file for complete search history.

(56) References Cited

U.S. PATENT DOCUMENTS

| | | | | |
|---|---|---|---|---|
| 5,136,364 | A | * | 8/1992 | Byrne ............................ 257/751 |
| 6,309,737 | B1 | | 10/2001 | Hirashima et al. |
| 7,128,844 | B2 | | 10/2006 | Tsukaguchi et al. |
| 7,904,627 | B2 | | 3/2011 | James |
| 8,766,100 | B2 | * | 7/2014 | Yuan et al. ..................... 174/255 |
| 2004/0115862 | A1 | * | 6/2004 | Kung et al. .................... 438/106 |
| 2011/0095418 | A1 | * | 4/2011 | Lim et al. ........................ 257/737 |
| 2014/0362552 | A1 | * | 12/2014 | Murayama et al. ........... 361/783 |

FOREIGN PATENT DOCUMENTS

| | | |
|---|---|---|
| JP | 2002-043507 | 2/2002 |
| JP | 2004-356502 | 12/2004 |
| JP | 2005-056269 | 3/2005 |
| KR | 10-1999-0000701 | 1/1999 |
| KR | 1020010110570 | 12/2001 |
| KR | 1020080013235 | 2/2008 |
| KR | 1020100048552 | 5/2010 |

OTHER PUBLICATIONS

Kim et al. "Environment-Friendly Trivalent Chromate Treatment for Zn Electroplating" J. Korean Ind. Eng. Chem., vol. 17(5), pp. 433-442, 2006.

* cited by examiner

*Primary Examiner* — Bernard Rojas
(74) *Attorney, Agent, or Firm* — Myers Bigel & Sibley, P.A.

(57) ABSTRACT

Package substrates, semiconductor packages including the package substrates, and methods for fabricating the semiconductor packages are provided. A package substrate may include a core including a first surface on which a semiconductor chip is disposed and a second surface opposite the first surface. The package substrate may also include a metal pad on the second surface of the core. The metal pad may include a saline water corrosion resistant surface.

21 Claims, 9 Drawing Sheets

PACKAGE SUBSTRATES, SEMICONDUCTOR PACKAGES HAVING THE PACKAGE SUBSTRATES

CROSS-REFERENCE TO RELATED APPLICATIONS

This U.S. non-provisional patent application claims priority under 35 U.S.C. §119 to Korean Patent Application No. 10-2012-0095594, filed on Aug. 30, 2012, in the Korean Intellectual Property Office, the disclosure of which is hereby incorporated by reference in its entirety.

FIELD

The present disclosure generally relates to the field of electronics, and more particularly semiconductor packages.

BACKGROUND

In a Chip-on-board (COB) type package, a semiconductor chip is directly mounted on a printed circuit board. COB-type packages may be used in a smart card product and a semiconductor chip inserted in the smart card product may have a contact with a card reader. Data may be read out from or written to the semiconductor chip through the contact with the card reader.

A COB-type package may include copper layers as circuits or electrodes. The copper layers may be plated with a layer including an expensive material such as, Au, Ni/Pd, or Ni/Au, to prevent the copper layers from being oxidized and to provide a surface for a wire bonding process.

SUMMARY

A semiconductor package may include a core including a first surface and a second surface opposite the first surface. The core may include a through hole penetrating through the core. The semiconductor package may also include a metal pad on the first surface of the core and the through hole may expose a portion of the metal pad. The semiconductor package may further include a semiconductor chip on the second surface of the core and the metal pad may include a saline water corrosion resistant surface.

In various embodiments, the semiconductor package may include a bonding wire electrically connecting the semiconductor chip to the metal pad and the bonding wire may pass through the through hole to connect to the metal pad.

In various embodiments, the semiconductor package may also include a through via in the through hole and electrically connected to the metal pad, a chip pad on the second surface of the core and electrically connected to the through via, and a solder bump on the semiconductor chip. The solder bump may contact the chip pad, thereby the semiconductor chip may be electrically connected to the metal pad According to various embodiments, the metal pad may include aluminum, stainless steel, or brass.

In various embodiments, the saline water corrosion resistant surface may include a surface film including chromium (Cr) and/or zirconium (Zr) on the metal pad.

In various embodiments, the core may include glass epoxy or prepreg material.

In various embodiments, the semiconductor package may include an adhesion layer between the first surface of the core and the metal pad.

A method of fabricating a semiconductor package, the method may include providing a core including a first surface and a second surface opposite the first surface, forming a through hole penetrating through the core and forming a metal pad on the first surface of the core. The method may also include treating a surface of the metal pad to form a saline water corrosion resistant surface. The method further include mounting a semiconductor chip on the second surface of the core and electrically connected to the metal pad and forming a molding layer on the second surface of the core encapsulating the semiconductor chip.

According to various embodiments, forming of the metal pad may include attaching a metal foil on the first surface of the core and patterning the metal foil to form the metal pad. The through hole may partially expose a lower surface of the metal pad and the core may entirely expose an upper surface of the metal pad. The metal foil may include aluminum, stainless steel or brass In various embodiments, the method may also include forming an adhesion layer on the first surface of the core before the attaching of the metal foil. The adhesion layer may extend between the first surface of the core and the metal pad.

In various embodiments, the method may further include forming a bonding wire passing through the through hole and electrically connecting the semiconductor chip to the metal pad.

According to various embodiments, the method may include forming a through via including a conductive material in the through hole, forming a chip pad on the second surface of the core and electrically connected to the through via, and forming a solder bump on the semiconductor chip. The through via may be electrically connected to the metal pad and the solder bump may contact the chip pad, thereby the semiconductor chip may be electrically connected to the metal pad.

In various embodiments, treating of the surface of the metal pad may include treating the surface of the metal pad with chemical including chromium (Cr) and/or zirconium (Zr).

According to various embodiments, the core may be mounted on a tape extending along a direction and the semiconductor chip may be one of a plurality of semiconductor chips mounted on respective ones of a plurality of package substrates. The method may further include cutting the tape to separate the ones of plurality of package substrates from one another.

A package substrate may include a core including a first surface on which a semiconductor chip is disposed and a second surface opposite the first surface. The package substrate may also include an aluminum pad on the second surface of the core. The aluminum pad may include a saline water corrosion resistant surface.

According to various embodiments, the saline water corrosion resistant surface may include a surface film of chromium (Cr) and/or zirconium (Zr) on the aluminum pad.

In various embodiments, the core may include a through hole penetrating through the core and the through hole may expose a surface of the aluminum pad.

In various embodiments, the surface of the aluminum pad exposed by the through hole may include chromium (Cr) and/or zirconium (Zr).

A semiconductor package may include a package substrate including a core including a through hole, an aluminum pad on a first surface of the core, and an anti-corrosion layer on the aluminum pad. The semiconductor package may also include a semiconductor chip on a second surface of the core opposite the first surface of the core and electrically connected to the aluminum pad by a bonding wire. The bonding wire may pass through the through hole. The semiconductor package may further include a molding layer encapsulating the semiconductor chip and the anti-corrosion layer may have a corrosion resistance to saline water.

According to various embodiments, the anti-corrosion layer may include a surface film of chromium (Cr) and/or zirconium (Zr) on the aluminum pad.

An integrated circuit (IC) package substrate may include a package core including an opening penetrating through the package core and a conductive pad on the package core. The opening may expose a portion of the conductive pad. The IC package may also include corrosion resistant layers on surfaces of the conductive pad exposed by the package core including the portion of the conductive pad exposed by the opening. The corrosion resistant layers may include chromium (Cr) or zirconium (Zr).

According to various embodiments, the conductive pad may include aluminum (Al).

In various embodiments, the conductive pad may include stainless steel or brass.

In various embodiments, the IC package may further include an adhesion layer between the package core and the conductive pad. The opening may penetrate through the adhesion layer to expose the portion of the conductive pad.

According to various embodiments, the package core may include a pre-impregnate material.

In various embodiments, the conductive pad may contact the package core.

In various embodiments, a memory card may include the IC package substrate and the memory card may further include a card body including a cavity, in which the IC package substrate may be disposed. The memory card may also include an integrated circuit on the package core and the package core may extend between the conductive pad and the integrated circuit. The memory card may further include a conductive pattern electrically connecting the integrated circuit to the portion of the conductive pad. The conductive pad may include a first surface facing the package core and a second surface opposite the first surface and the card body may expose the second surface of the conductive pad.

In various embodiments, the conductive pattern may include a conductive wire including gold.

According to various embodiments, the integrated circuit may include a solder bump thereon and the conductive pattern may include a through via and a chip pad. The through via may be in the opening and may contact the portion of the conductive pad, and the chip pad may be on the package core and may electrically connect the through via to the solder bump.

In various embodiments, the memory card may include a mold layer covering the integrated circuit and the conductive pattern.

DETAILED DESCRIPTION

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A, 2A, 3A, 4A, and 5A are sectional views illustrating methods of fabricating semiconductor packages according to some embodiments of the inventive concept. FIGS. 1B, 2B, 3B, 4B, and 5B are plan views of FIGS. 1A, 2A, 3A, 4A, and 5A, respectively, FIG. 4C is a plan view illustrating of a semiconductor package according to some embodiments of the inventive concept.

Figure 1A:
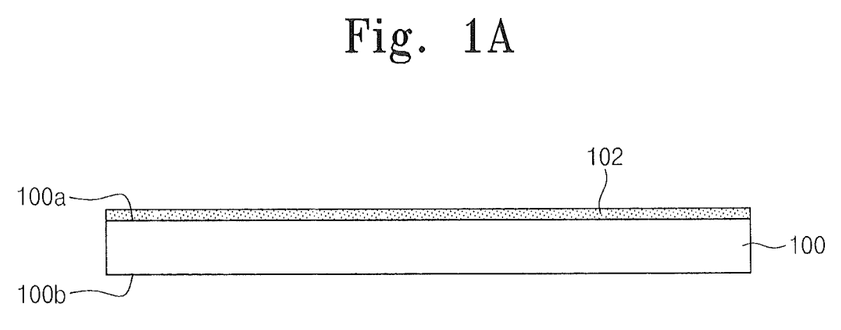
FIGS. 1A, 2A, 3A, 4A, and 5A are sectional views illustrating methods of fabricating semiconductor packages according to some embodiments of the inventive concept.
Figure 1B:
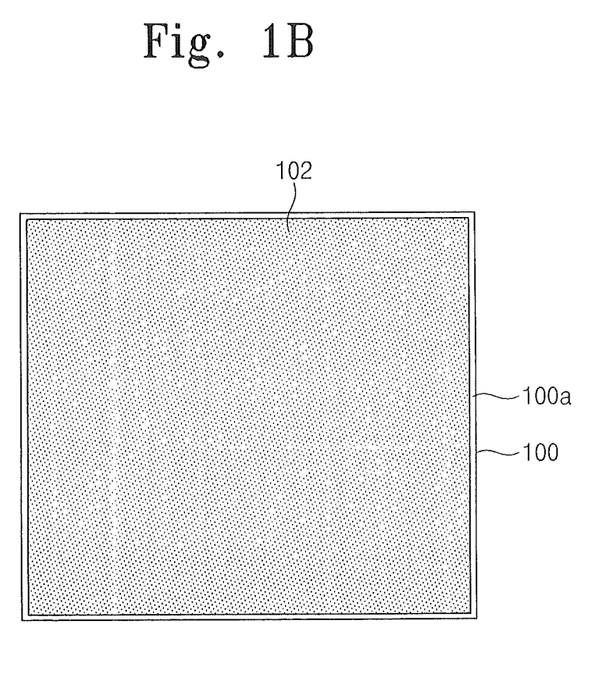
FIGS. 1B, 2B, 3B, 4B, and 5B are plan views of FIGS. 1A, 2A, 3A, 4A, and 5A, respectively.

Referring to FIGS. 1A and 1B, a core 100 may be provided. The core 100 may include a polymer layer (e.g., glass epoxy) having a first surface 100a and a second surface 100b facing each other. An adhesion layer 102 may be further formed on the first surface 100a of the core 100. The core 100 may have a size corresponding to that of one semiconductor package and have a rectangular or square shape. Alternatively, the core 100 may have a reel shape as shown in FIG. 4C, and thus, a plurality of semiconductor packages can be formed on the core 100.

Figure 2A:
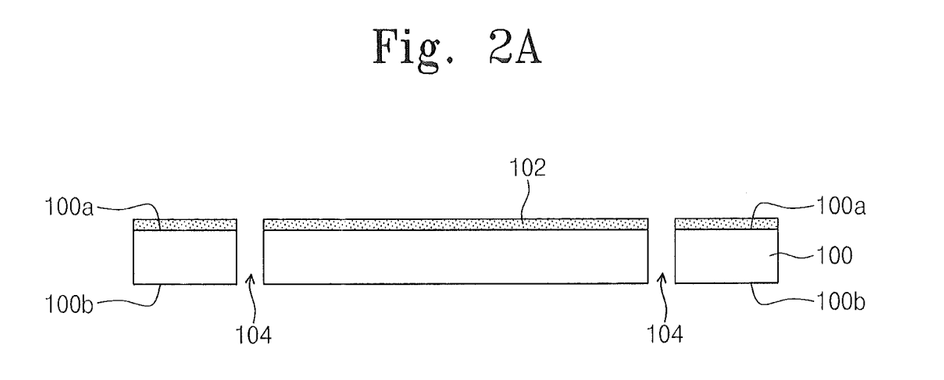
Figure 2B:
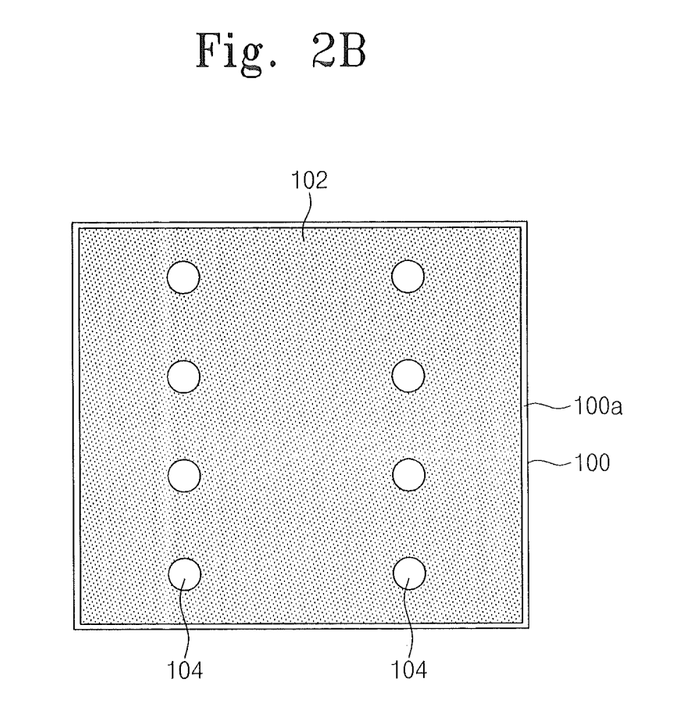

Referring to FIGS. 2A and 2B, a plurality of through holes 104 may be formed to vertically penetrate the core 100. Each of the through holes 104 may be shaped like a circle. In some embodiments, the through holes 104 may be arranged in columns. In the case where the adhesion layer 102 is additionally provided, the through holes 104 may be formed to further penetrate the adhesion layer 102.

Figure 3A:
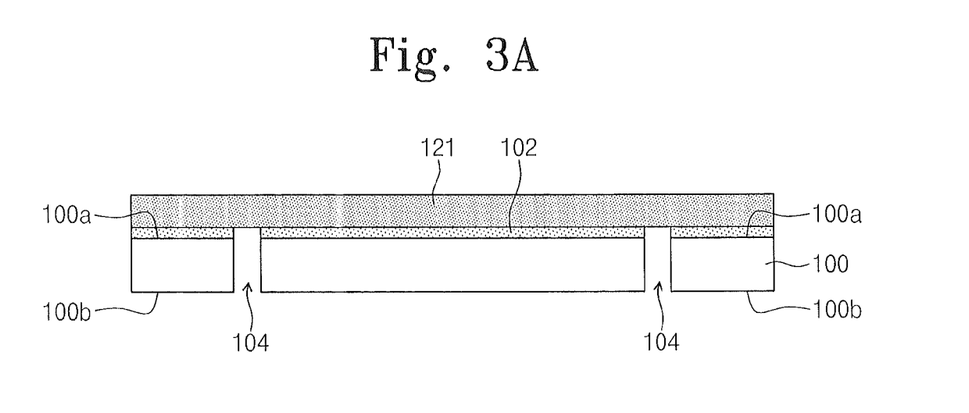
Figure 3B:
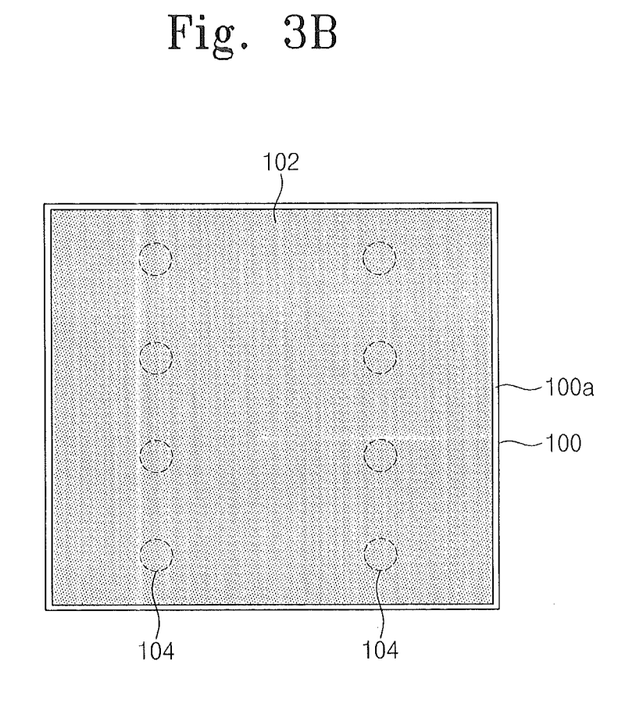

Referring to FIGS. 3A and 3B, an aluminum layer 121 may be attached onto the first surface 100a of the core 100. For example, the aluminum layer 121 may be an aluminum foil that is attached on the adhesion layer 102 and has a thickness less than that of the core 100. In some embodiments, the thickness of the aluminum layer 121 may be in a range of about ⅓ to ⅔ of thickness of the core 100. For example, the core 100 may have a thickness of about 100-120 μm (e.g., 110 μm), and the aluminum layer 121 may have a thickness of about 40-80 μm (e.g., 70 μm). The adhesion layer 102 may have a thickness of about 10-15 μm. An end portion of each of the through holes 104 may be closed by the aluminum layer 121, while the other end portion is open.

Figure 4A:
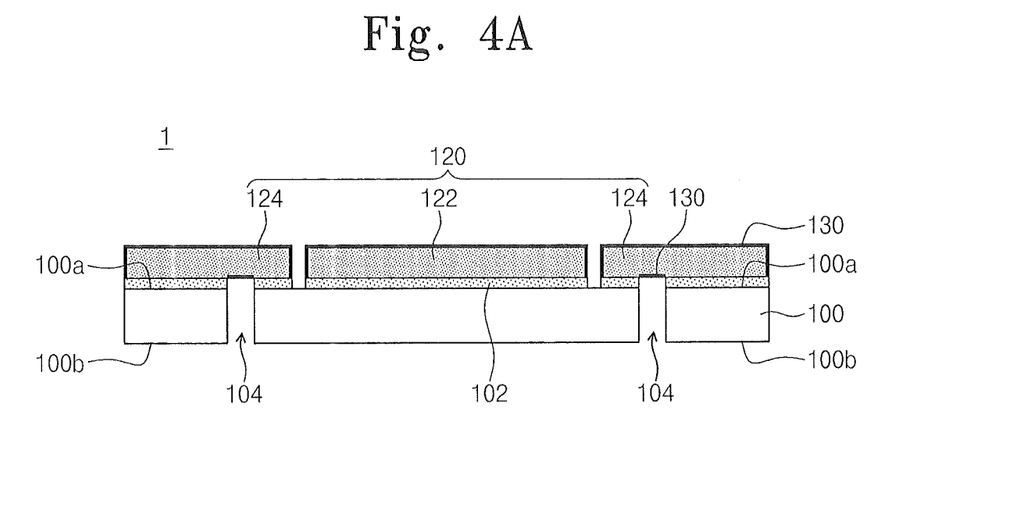
Figure 4B:
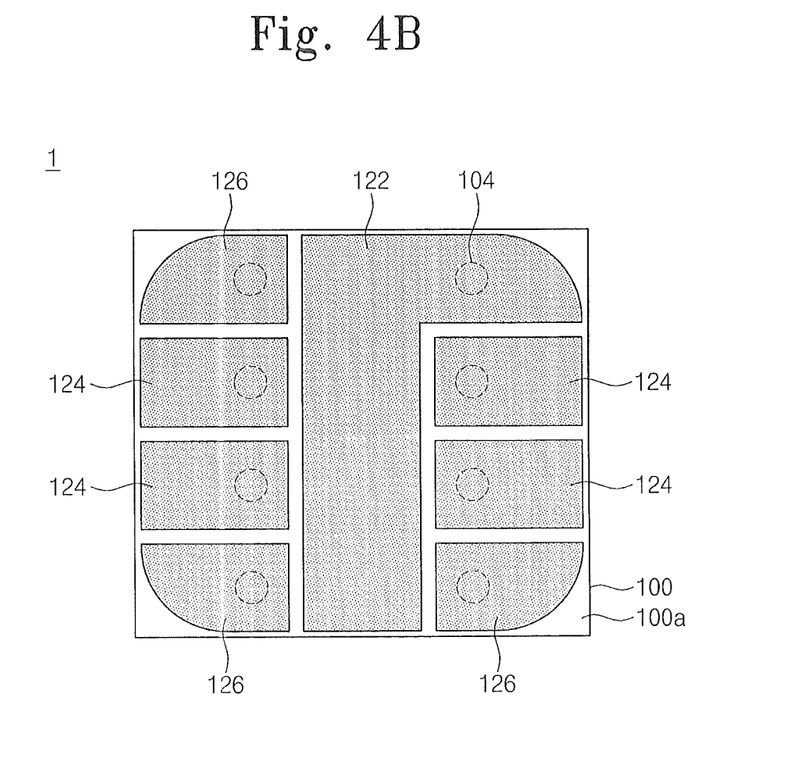
Figure 4C:
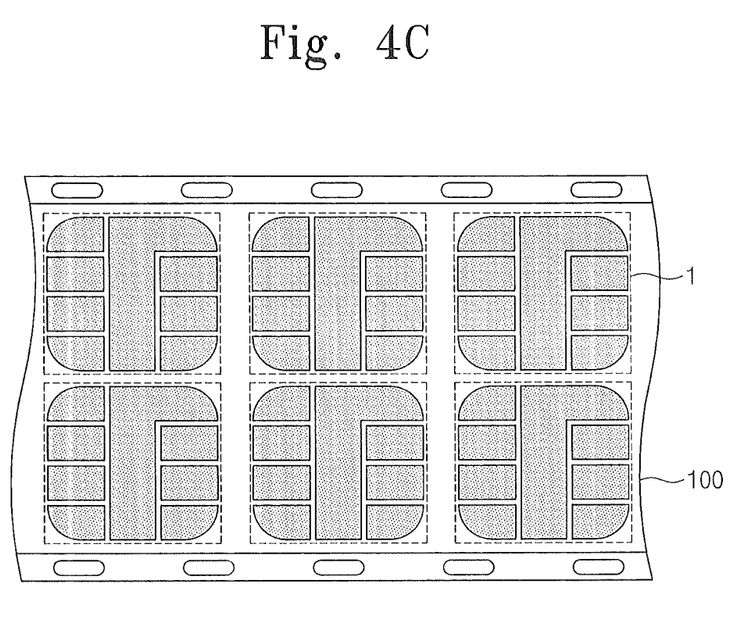
FIG. 4C is a plan view illustrating of a semiconductor package according to some embodiments of the inventive concept.

Referring to FIGS. 4A and 4B, the aluminum layer 121 may be patterned to form aluminum pads 120. The aluminum pads 120 may include a plurality of pads 122, 124, and 126. For example, the aluminum pads 120 may include a first pad 122, which extends from a central region of the core 100 to one of edges of the core 100 to have an "L" shape and is used to transmit a ground signal, second pads 124, which are provided at central regions of both side regions of the core 100 and used to transmit data signals, and third pads 126, each of which is provided at corners of the core 100 to transmit a power signal and/or to serve as a dummy pad. However, embodiments of the inventive concepts may not be limited to the exemplified shape, purpose, and/or arrangement of the pads 122, 124, and 126. A bottom surface of the aluminum pad 120 adjacent to the first surface 100a of the core 100 may be partially exposed by the through holes 104, and top and side surfaces thereof may be entirely exposed by the core 100.

According to some embodiments of the inventive concept, a gold wire 144 can be easily bonded to the aluminum pad 120. If the pad is formed of non-aluminum metal (e.g., copper), a plating layer (e.g., of Ni/Au or Ni/Pd) on the copper pad may be formed for Au wire bonding. However, if the pad 120 is formed of aluminum, the process of forming the plating layer may not be performed. In addition, a stable oxide layer (e.g., $Al_2O_3$) may be formed on the aluminum pad 120 through a natural oxidation, and thus a surface defect (e.g., surface bronzing) may be reduced.

In some embodiments, a surface layer 130 may be formed on the aluminum pad 120 by a surface treatment process. For example, the surface treatment process may include dipping the core 100 into solution containing chromium (Cr), zirconium (Zr), or a mixture thereof or chemically treating a surface of the aluminum pad 120 using electroplating or electroless plating technology. The surface layer 130 may be formed on the top and side surfaces of the aluminum pad 120 and on portions of the bottom surface of the aluminum pad 120 exposed by the through holes 104. In some embodiments, the surface layer 130 may be provided in the form of film covering the surface of the aluminum pad 120. Alternatively, the surface treatment may change the surface of the aluminum pad 120 into the surface layer 130 having high chemical concentration. As the result of the surface treatment process, the aluminum pad 120 can have an increased corrosion resistance to saline water or NaCl.

Alternatively, after the formation of the aluminum layer 121 shown in FIG. 3A, the aluminum layer 121 may be chemically treated with chromium (Cr), zirconium (Zr), or a mixture thereof, and then, be patterned to form the aluminum pad 120.

The package substrate 1 may be formed to include the glass epoxy core 100 and the aluminum pad 120 thereon. As shown in FIG. 4C, where the core 100 is shaped like a reel, the core 100 may be separated to a plurality of the package substrates 1 by a slitting process. In some embodiments, the package substrate 1 may include a pad 120 containing stainless steel or brass instead of Al.

Figure 5A:
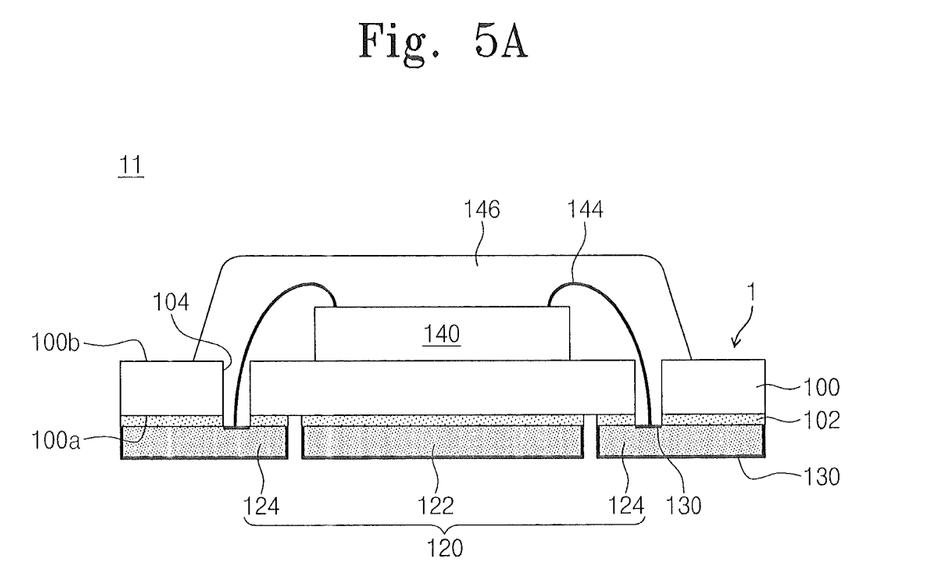
Figure 5B:
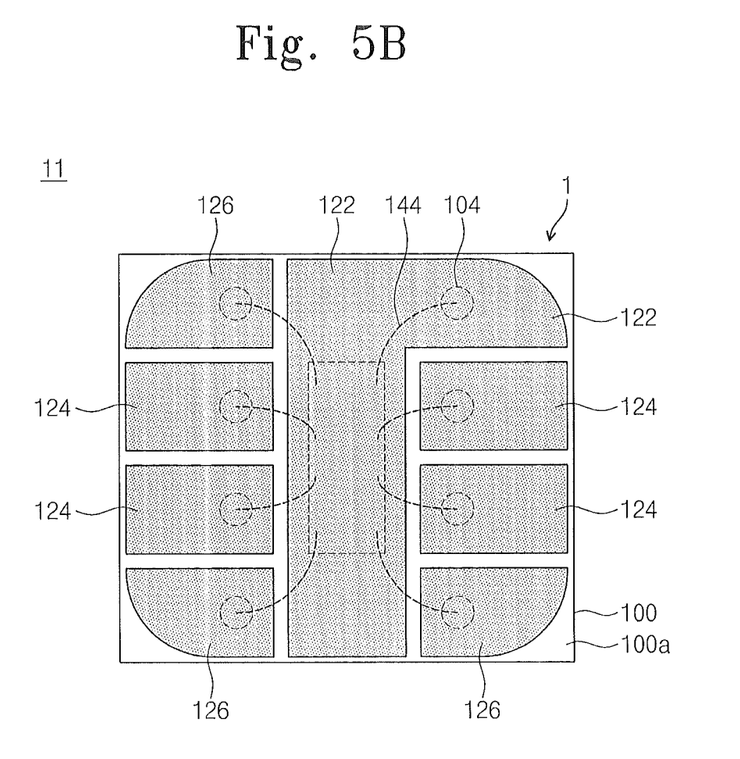

Referring to FIGS. 5A and 5B, a semiconductor chip 140 may be mounted on the package substrate 1 and then a molding process may be performed. For example, the semiconductor chip 140 may be mounted on the second surface 100b of the core 100 and the gold wires 144 may be formed to electrically connect the semiconductor chip 140 to the package substrate 1. The gold wires 144 may connect to the aluminum pad 120 passing through the through holes 104. During the molding process, a molding layer 146 may be formed on the second surface 100b of the core 100 to encapsulate the semiconductor chip 140, and as a result, a first semiconductor package 11 may be formed to have a chip-on-board (COB) structure.

Figure 6:
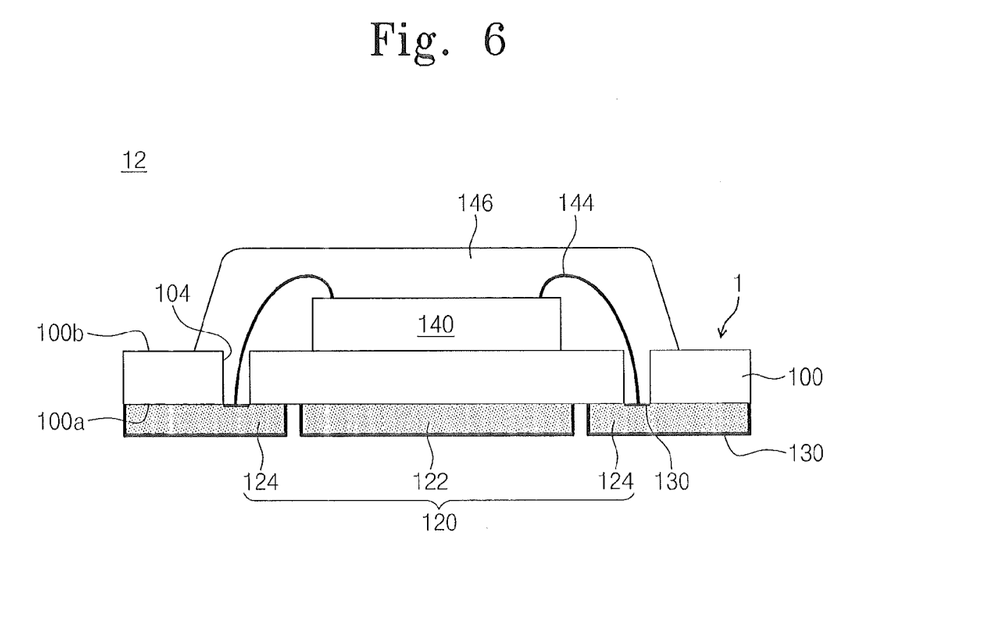
FIGS. 6 and 7 are sectional views of semiconductor packages according to some embodiments of the inventive concept.
Figure 7:
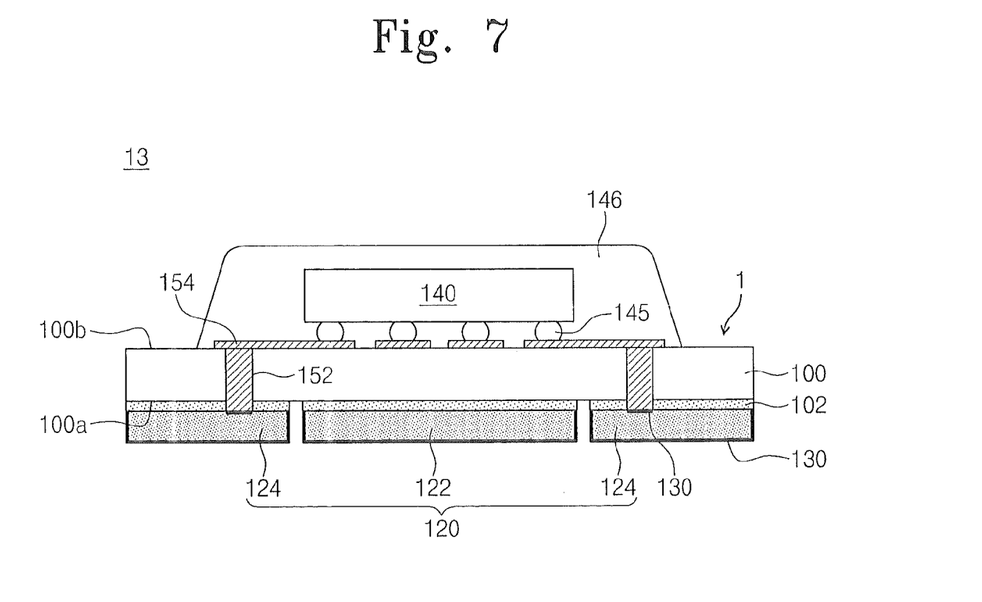

FIGS. 6 and 7 are sectional views of semiconductor packages according to some embodiments of the inventive concept.

Referring to FIG. 6, a second semiconductor package 12 may be configured to have a chip-on-board (COB) structure. For example, in the second semiconductor package 12, the aluminum pad 120 may be provided on the first surface 100a of the core 100 and the semiconductor chip 140 may be mounted on the second surface 100b of the core 100 and connect to the package substrate 1 using a wire bonding. In some embodiments, the core 100 may include at least one of pre-impregnated materials (or prepreg). The prepreg may exhibit an adhesive property in a B-stage (or half-cured state), unlike a C stage (or cured state) of the glass epoxy. Accordingly, there may be no need to form the adhesion layer 102 between the core 100 and the aluminum pad 120 of the second semiconductor package 12.

Referring to FIG. 7, a third semiconductor package 13 may be configured to have a flip-chip package structure, in which the semiconductor chip 140 is mounted on the package substrate 1 in a flip-chip bonding manner. The semiconductor chip 140 may be mounted on the second surface 100b of the core 100 in a face-down manner and electrically connects to the package substrate 1 via solder bumps 145. The package substrate 1 may include a through via 152, which electrically connects to the aluminum pad 120 and penetrates the core 100, and a chip pad 154 electrically connecting the through via 152 to the solder bump 145. The chip pad 154 may be redistributed. The aluminum pad 120 may be chemically treated with chromium (Cr), zirconium (Zr), or a mixture thereof, thereby having an increased corrosion resistance to saline water or NaCl. Where the core 100 includes glass epoxy, the adhesion layer 102 may be interposed between the core 100 and the aluminum pad 120. Where the core 100 includes prepreg, the adhesion layer 102 may not be formed between the core 100 and the aluminum pad 120.

Figure 8:
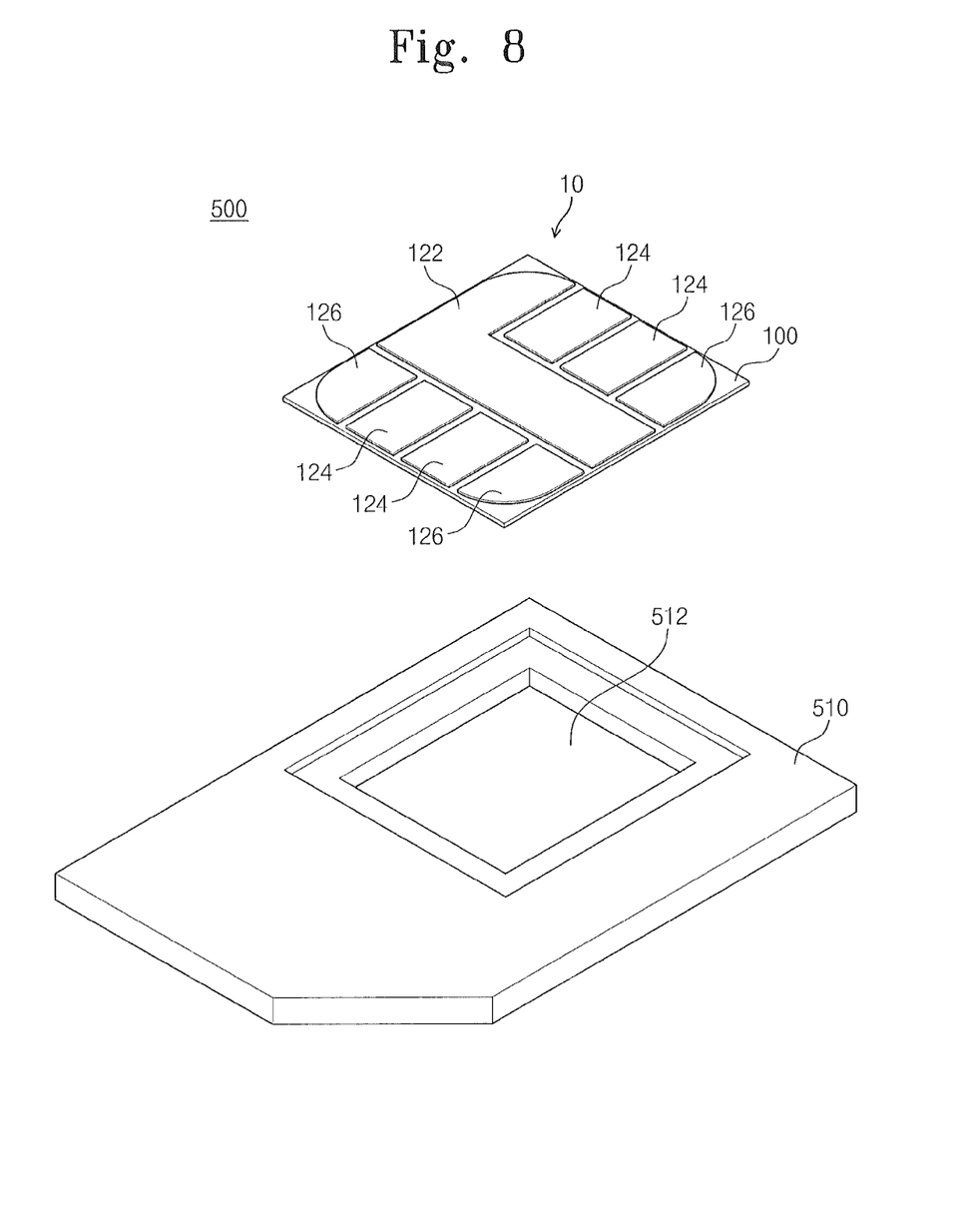
FIG. 8 is a perspective view of a smart card including a semiconductor package according to some embodiments of the inventive concept.

FIG. 8 is a perspective view of a smart card including a semiconductor package according to some embodiments of the inventive concept.

Referring to FIG. 8, a smart card 500 may include a semiconductor package 10 and a card body 510. The card body 510 may include a cavity 512 in which the semiconductor package 10 is inserted. The semiconductor package 10 may be one of the first to third semiconductor packages 11, 12, and 13 described above. The semiconductor package 10 may be inserted into the cavity 512 in such a way that the aluminum pad 120 is exposed.

According to some embodiments of the inventive concept, a pad and an electrode of a package substrate may be formed of a foil made of aluminum, stainless steel, or brass. A conventional plating process may not be performed and thus a fabrication cost may be lowered. In some embodiments, since the pad of the package substrate is formed of aluminum, and a wire bonding process can performed without a pad plating process and technical difficulties, such as surface bronzing, may be reduced. In addition, the pad of the package substrate may be chemically treated using chromium (Cr) or zirconium (Zr), thereby having an increased corrosion resistance with respect to saline water and thus corrosion of the package may be reduced and durability of the package may be improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package comprising:
   a core comprising a first surface and a second surface opposite the first surface, the core including a through hole penetrating through the core;
   a metal pad on the first surface of the core, the through hole exposing a portion of the metal pad; and
   a semiconductor chip on the second surface of the core,
   wherein the metal pad comprises a saline water corrosion resistant surface.

2. The semiconductor package of claim 1, further comprising a bonding wire electrically connecting the semiconductor chip to the metal pad,
   wherein the bonding wire passes through the through hole to connect to the metal pad.

3. The semiconductor package of claim 1, further comprising:
   a through via in the through hole and electrically connected to the metal pad;
   a chip pad on the second surface of the core and electrically connected to the through via; and
   a solder bump on the semiconductor chip,
   wherein the solder bump contacts the chip pad, thereby the semiconductor chip is electrically connected to the metal pad.

4. The semiconductor package of claim 1, wherein the metal pad comprises aluminum, stainless steel, or brass.

5. The semiconductor package of claim 1, wherein the saline water corrosion resistant surface comprises a surface film comprising chromium (Cr) and/or zirconium (Zr) on the metal pad.

6. The semiconductor package of claim 1, wherein the core comprises glass epoxy or prepreg material.

7. The semiconductor package of claim 1, wherein the saline water corrosion resistant surface comprises a first saline water corrosion resistant surface,
   wherein the metal pad comprises a first surface and a second surface opposite the first surface of the metal pad, and the first surface of the metal pad faces the first surface of the core and comprises the first saline water corrosion resistant surface, and
   wherein the second surface of the metal pad comprises a second saline water corrosion resistant surface.

8. A package substrate comprising:
   a core comprising a first surface on which a semiconductor chip is disposed and a second surface opposite the first surface; and
   an aluminum pad on the second surface of the core,
   wherein the aluminum pad comprises a first surface and a second surface opposite the first surface of the aluminum pad, and the first surface of the aluminum pad faces the second surface of the core and comprises a first saline water corrosion resistant surface, and
   wherein the second surface of the aluminum pad comprises a second saline water corrosion resistant surface.

9. The package substrate of claim 8, wherein each of the first and second saline water corrosion resistant surfaces comprises a surface film of chromium (Cr) and/or zirconium (Zr) on the aluminum pad.

10. The package substrate of claim 8, wherein the core comprises a through hole penetrating through the core and the through hole exposes a portion of the first surface of the aluminum pad, and
   wherein the portion of the first surface of the aluminum pad exposed by the through hole comprises the first saline water corrosion resistant surface.

11. The package substrate of claim 10, wherein the first and second saline water corrosion resistant surfaces each comprises a surface film of chromium (Cr) and/or zirconium (Zr) on the aluminum pad.

12. An integrated circuit (IC) package substrate, comprising:
   a package core comprising an opening penetrating through the package core;
   a conductive pad on the package core, the opening exposing a portion of the conductive pad; and
   corrosion resistant layers on surfaces of the conductive pad exposed by the package core including the portion of the conductive pad exposed by the opening, the corrosion resistant layers comprising chromium (Cr) or zirconium (Zr).

13. The IC package substrate of claim 12, wherein the conductive pad comprises aluminum (Al).

14. The IC package substrate of claim 12, wherein the conductive pad comprises stainless steel or brass.

15. The IC package substrate of claim 12, further comprising an adhesion layer between the package core and the conductive pad, the opening penetrating through the adhesion layer to expose the portion of the conductive pad.

16. The IC package substrate of claim 12, wherein the package core comprises a pre-impregnate material.

17. A memory card comprising the IC package substrate of claim 12, the memory card further comprising:
   a card body comprising a cavity, in which the IC package substrate is disposed;
   an integrated circuit on the package core, the package core extending between the conductive pad and the integrated circuit; and
   a conductive pattern electrically connecting the integrated circuit to the portion of the conductive pad,
   wherein the conductive pad comprises a first surface facing the package core and a second surface opposite the first surface, and the card body exposes the second surface of the conductive pad.

18. The memory card of claim 17, wherein the conductive pattern comprises a conductive wire comprising gold.

19. The memory card of claim 17, wherein the integrated circuit comprises a solder bump thereon and the conductive pattern comprises a through via and a chip pad, and wherein the through via is in the opening and contacts the portion of the conductive pad, and the chip pad is on the package core and electrically connects the through via to the solder bump.

20. The memory card of claim 17, further comprising a mold layer covering the integrated circuit and the conductive pattern.

21. The IC package substrate of claim 12, wherein the surfaces of the conductive pad comprises a first surface and a second surface opposite the first surface, and
   wherein the first surface comprises the portion of the conductive pad exposed by the opening, and one of the corrosion resistant layers is on the second surface.

\* \* \* \* \*